(12) United States Patent
Brunner et al.

(10) Patent No.: US 7,710,710 B2
(45) Date of Patent: May 4, 2010

(54) ELECTRICAL COMPONENT AND CIRCUIT CONFIGURATION WITH THE ELECTRICAL COMPONENT

(75) Inventors: Sebastian Brunner, Graz (AT); Christian Block, Stainz (AT); Thomas Feichtinger, Graz (AT); Gunter Pudmich, Koflach (AT)

(73) Assignee: EPCOS AG, Munich (DE)

( * ) Notice: Subject to any disclaimer, the term of this patent is extended or adjusted under 35 U.S.C. 154(b) by 469 days.

(21) Appl. No.: 11/220,352

(22) Filed: Aug. 31, 2005

(65) Prior Publication Data

US 2006/0170010 A1   Aug. 3, 2006

(30) Foreign Application Priority Data

Mar. 1, 2004   (DE) .................. 10 2004 010 001

(51) Int. Cl.
*H01G 4/228* (2006.01)
*H01G 4/06* (2006.01)
*H01G 4/20* (2006.01)
*H01G 4/30* (2006.01)

(52) U.S. Cl. .............. 361/306.3; 361/306.1; 361/311; 361/313; 361/301.4

(58) Field of Classification Search ............... 361/306.3
See application file for complete search history.

(56) References Cited

U.S. PATENT DOCUMENTS

| 5,495,387 A | 2/1996 | Mandai et al. |
| 5,815,367 A * | 9/1998 | Asakura et al. ............. 361/303 |
| 6,795,295 B2 * | 9/2004 | Murakami et al. ........ 361/306.3 |
| 7,012,501 B2 * | 3/2006 | Krumphals et al. ........... 338/21 |
| 2002/0043698 A1 * | 4/2002 | Raghavendra et al. ....... 257/528 |
| 2003/0142460 A1 * | 7/2003 | Naito et al. .............. 361/306.1 |
| 2003/0147197 A1 | 8/2003 | Uriu et al. |
| 2004/0239476 A1 * | 12/2004 | Krumphals et al. ........... 338/48 |

FOREIGN PATENT DOCUMENTS

| DE | 10224565 | 12/2003 |
| EP | 1 115 129 | 7/2001 |
| JP | 03-060148 | 3/1991 |
| JP | 2000-226689 | 8/2000 |

OTHER PUBLICATIONS

Meinke et al., "Taschenbuch der Hochfrequenztechnik", Funfte Auflage, Herausgegeben von K. Lange und K.-H.Locherer, Band 2 Komponenten, Chapter 6.1, 2 pages and English translation, Phase Shifting by Means of a Series Resistor, 2 pages.
Using Breakthrough Technology, We Aim for Products that will create New Markets, New Product News, Dec. 21, 2009, 1 page.

* cited by examiner

*Primary Examiner*—Stephen W Jackson
*Assistant Examiner*—Dharti H Patel
(74) *Attorney, Agent, or Firm*—Fish & Richardson P.C.

(57) ABSTRACT

An electrical component includes ceramic layers that are stacked to form a base body, electrode layers among the ceramic layers to form at least one capacitor, at least one phase gate on a ceramic layer that corresponds to a surface of the base body, contact surfaces on a top surface of the base body, and through contacts that electrically connect the electrode layers to the contact surfaces. The through contacts are inside the base body at least in part. Side surfaces of the base body are substantially free of surface metallic contacts and of metal plating.

27 Claims, 8 Drawing Sheets

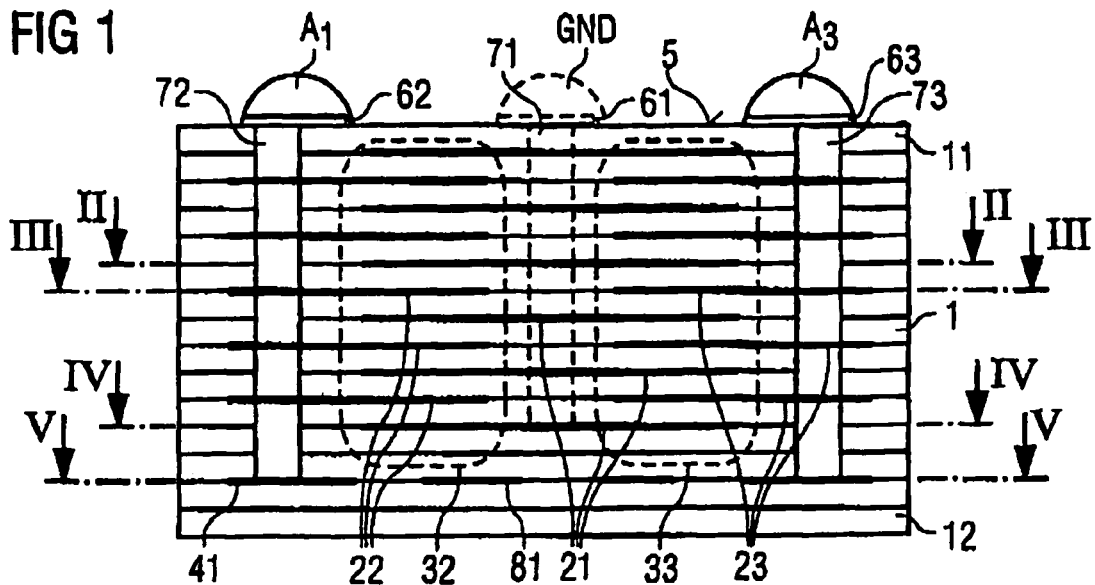
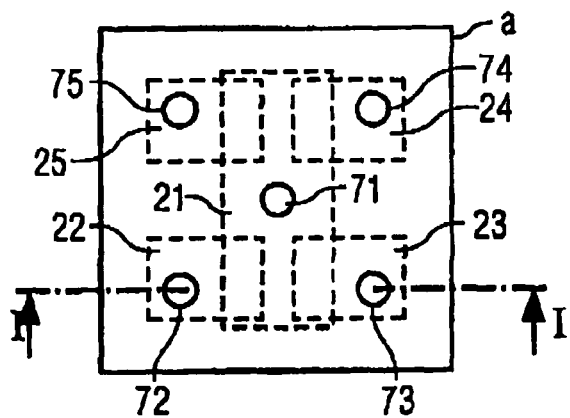
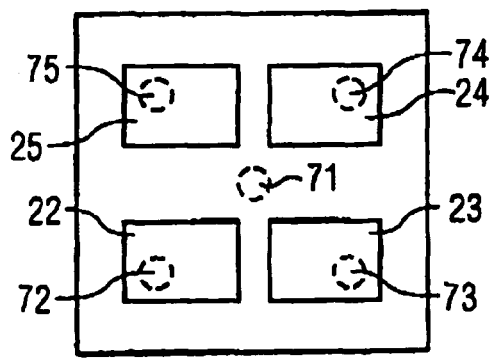

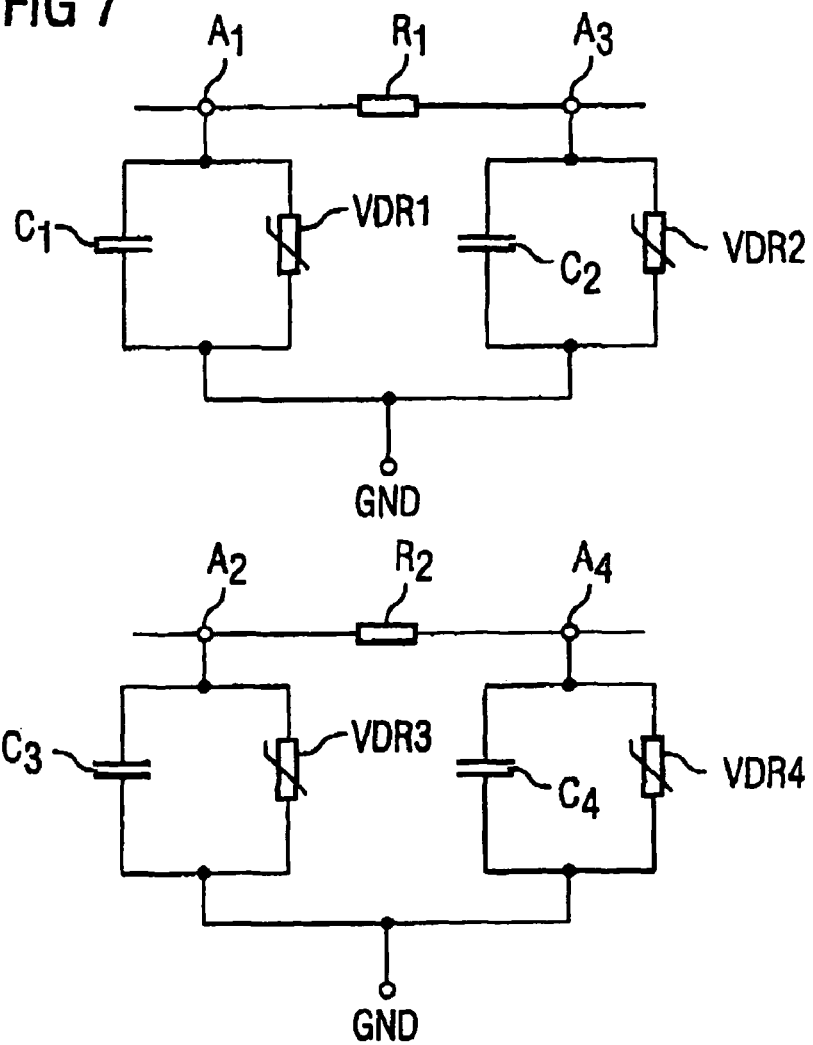
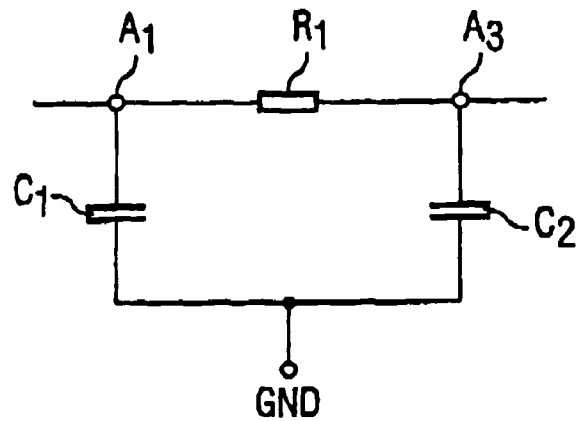

ELECTRICAL COMPONENT AND CIRCUIT CONFIGURATION WITH THE ELECTRICAL COMPONENT

TECHNICAL FIELD

The application relates to an electrical component and a switching mechanism with the component. Preferably the component has an electroceramic multi-layered component that includes other capacities and a phase gate.

BACKGROUND

From the publication JP03060148 a laminated LCR element is known which provides a capacitance between two electrode layers in a sequence of layers stacked one on top of the other. To contact the electrode layers, they are conducted up to the edge of the sequence of layers, whereby outer contacts are arranged on the front surfaces of the component body.

From the publication JP2000226689A a component is known in which electrode layers located inside a multi-layered sequence are contacted, both by lateral outer electrodes and by solder balls arranged on the top side of the component.

An electrical component is indicated which provides a sequence of ceramic layers lying one on top of the other. Preferably electrode layers are provided between ceramic layers. The electrode layers can form at least one capacitor.

It is also advantageous if the ceramic layers lying one on top of the other form a base body, whereby contact surfaces are arranged on the outer surface of the base body.

In addition to at least one capacitor, it is advantageous if another electrical function is integrated in the form of a phase gate. The phase gate is thereby arranged on the top surface of the base body of its ceramic layer.

The electrode layers are further connected in an electrically conductive manner with the contact surfaces by means of the through contacts running inside the base body. The side surfaces of the base body are free of surface metallic contacts/ free of metal plating.

The component indicated here makes use of the basic idea according to which capacitors are integrated into an electroceramic multi-layered component. For one thing, outwardly contacting the capacitors by means of through contacts largely eliminates parasitic influences that negatively affect the function or the properties of the component. In addition, the use of through contacts also provides an extremely space-efficient contact with the component.

By integrating at least one other phase gate in addition to the capacitor, especially advantageous filter elements can be realized, whereby the filter element with the capacitor and the phase gate has two electrical basic components that rotate the phase of an AC signal in opposite directions. This allows the creation of filters with good properties, for example high insertion loss and broadband filter characteristics. At the same time, the phase gate rotates the phase between voltage and power in a direction opposite to that of the capacitor. For example, the capacitor rotates the phase in the positive direction, while the phase gate rotates the phase in the negative direction.

By arranging the phase gate on a ceramic layer, the phase gate can be integrated into the component in such a way that little space is used. Connecting the capacitor with contact surfaces on an outer surface of the base body makes it easy and convenient to contact the component, for example on a printed circuit board.

In one advantageous embodiment of the component, the phase gate can be represented by a resistor or by an inductance. An especially advantageous option is to design the phase gate as a layer resistor. A layer resistor of this type can be integrated in an especially space-efficient manner by arranging it on a ceramic layer in the component.

In one especially advantageous embodiment of the component, all ceramic layers are made of the same material. This allows the component to be made especially light by jointly sintering ceramic green film. In this case, any shrinkage that occurs cannot be adjusted.

Another embodiment of the component provides that all ceramic layers contain an electrical functional ceramic. The term "electrical functional ceramics" means materials that, for example, provide a high dielectric constant when capacitors are realized or, for example, provide a suitable voltage dependency for their resistors when varistors are realized. In terms of the component described here, functional ceramics above all have the property that they provide at least one electrical function in addition to the mechanical support function that gives the component its mechanical stability and which also supports electrode layers or other electrically conductive elements. The voltage dependency of the electrical resistor or the dielectricity constant was already indicated.

However, other material properties that can make an electrical functional ceramic from a conventional ceramic material used as a support are also possible. Specifically, a temperature dependency of the electrical resistor, a temperature dependency of the dielectricity constant or other similar properties are possible. Especially interesting for this invention are materials that are needed for realizing capacitors, varistors or inductances.

Also advantageous is a component in which the electrode layers and phase gates are contacted exclusively by means of the contact surfaces. The contact surfaces are located on an outer side of the base body, preferably on the top or bottom side of the base body, whereby the contact surfaces are contacted by means of through contacts. This embodiment of the component has the advantage that an especially space-efficient contact can be achieved. This embodiment also has the advantage that outer contacts to be arranged on the sides of the base body can be eliminated. This reduces the overall surface needed for the contacts, which can drastically reduce the component's susceptibility to failure as well as drastically reduce parasitic capacities and inductances.

In another embodiment of the component, the electrode layers and the phase gates are arranged at various planes. The electrode layers and the phase gates are advantageously arranged on top of one another. This has the advantage that only a relatively small footprint is used to create the component. Such components can be advantageously used especially in applications where space is a critical factor.

In one especially advantageous embodiment, the component can be designed so that the basic space requirement for the base body is only limited by the necessary capacity or by the required electrical resistor or the required inductance. The number of capacitors also limits the footprint required to integrate several capacitors that are located next to one another in the component.

A through contact generally has the property that it electrically connects the top side of a ceramic layer with its bottom side in an electrically conductive manner and to that end passes through the ceramic layer in the "thick" direction. For example, providing the ceramic layer with a hole that is filled with a conductive paste can create a through contact.

The through contact can also be manipulated in the process of common integration during the sintering of the sequence of ceramic layers.

In another embodiment of the component, the capacitors and the phase gates form a filter switch. It is especially advantageous if the elements that are part of the filter are connected inside the base body. For example, the use of through contacts can be especially helpful in this instance.

In another embodiment of the component, a common contact surface is arranged in the middle of the outer surface; the contact surface is connected to one or more electrode layers. The common contact surface is preferably reconnected to the electrode layer or layers by a through contact. The electrode layers connected to the common contact surface form common electrodes for several capacitors. This means that the common electrodes can form the counter electrodes for various capacitors.

Another embodiment of the component provides a symmetrical design in which the component is formed symmetrically at a level that runs through the common contact surface. In this example, the common outer contact surface forms a point of symmetry, and the component can be symmetrically created around this point of symmetry. This design has the advantage of being very easy to manufacture.

In one particularly advantageous embodiment of the component, a phase gate is executed as a layer resistor or as a layer inductance. All phase gates can also be executed as layer resistors. It is also possible to execute one phase gate as a layer resistor and another phase gate as layer inductances.

The inductance can be present as a conductive path that is curved in several places, for example in the form of a meander or a spiral.

In another embodiment of the component, multiple filters are integrated. This embodiment has the advantage that the space-saving effect is increased. This can be realized, for example, by having several capacitors use the common electrodes.

In another embodiment of the component, a broadband filter is formed for electromagnetic interferences. Such a filter can, for example, filter frequency ranges between 800 MHz and 2500 MHz. However, using the component described here, it is also possible to create filters against electromagnetic interferences (RFI filters); these filters filter down into the kHz range.

In another embodiment of the component, one or more varistors can be contained. Varistors have the advantage that they facilitate the creation of ESD (Electro-Static Discharge) filters. Varistors are characterized in that they have a voltage dependent resistor. In the context of the component described here, they can, for example, be realized by arranging a ceramic layer containing a varistor material between two electrode layers. From the two electrode layers is created a component that represents a parallel circuit consisting of one varistor and one capacitor.

Another embodiment of the component provides that a common electrode layer overlaps four different areas of other electrode layers. With the help of one such embodiment, four different capacitors can be integrated into one component of the type described here, which is particularly space-efficient.

In another embodiment of the component, several identical filters can be integrated.

In another embodiment of the component, several different filters can be integrated.

In this connection, "identical filters" means those filters where the circuitry of the electrical components is identical and where the electrical components essentially exhibit the same characteristics.

In another embodiment of the component, a layer resistor can be arranged between two ceramic layers. With regard to this embodiment, it should be noted that the material for the layer resistor preferably should be a material that can be co-fired with the ceramic layers involved. In terms of varistor ceramics, in this instance it is especially advantageous to use for the layer resistor a metalliferous paste that is also used for the electrode layers. To obtain relatively high resistance values, it is therefore advantageous to execute the layer resistor in the form of a path curved in several places. With the help of this type of path that is curved in several places, resistances between 0.1 and 50 $\Omega$ can be realized. Such a component can be a particular advantage when used in circumstances where negligible dissipation loss and therefore negligible resistances are desired.

In another embodiment of the component, the layer resistor is arranged on an outer side of a ceramic layer. In this case, there is a greater range of possibilities in the selection of the layer-resistor materials because when the layer resistor is attached to an outer side of a ceramic layer, co-firing is no longer absolutely required. In addition and especially in this case, the use of the materials typically used for high resistances, for example $RuO_2$, can significantly reduce the existing risk of damage to the ceramic. Such a risk is especially pronounced for varistor ceramics. In this case, one would first debind and then sinter the sequence of ceramic layers lying one on top of the other. The layer resistor is only applied as the last temperature step is being carried out. Because of the moderate temperatures employed during the last temperature step, it is no longer possible for the layer-resistor material to damage the ceramic layers. With the help of such a layer resistor applied on an outer side of a ceramic layer or on an outer side of the base body, resistance values between 0.05 and 100 $\Omega$ or even more can be realized. This embodiment is especially advantageous for filter applications requiring an impedance adjustment. Protective layers of insulation applied later can cover the layer resistor arranged on the surface.

Another embodiment of the component provides that the footprint of the base body be smaller than 2.5 $mm^2$. The footprint is thus the top or bottom side of the base body, which lies parallel to the ceramic layers, one of which supports the contact surfaces. In this case, at least four capacitors and two phase gates are integrated.

In another embodiment of the component, the footprint of the base body measures less than 5.12 $mm^2$. In this case, at least eight capacitors and at least four phase gates are integrated.

In another embodiment of the component, the footprint of the base body measures less than 8 $mm^2$. In this case, eight, ten, twelve or even more capacitors are integrated. At least four phase gates are also integrated.

In another embodiment of the component, all capacitors integrated into the base body have the same capacity. In addition, all integrated phase gates exhibit the same electrical characteristics. For example, all integrated resistors would exhibit the same resistance. All integrated inductances would exhibit the same inductance.

In another embodiment of the component, at least two capacitors that exhibit different capacities are integrated. In addition, at least two phase gates that exhibit different characteristics are integrated. For example, two resistors that exhibit different resistances are integrated. Furthermore, two inductances that exhibit different inductances can also be integrated.

Another embodiment of the component provides a capacitor material as the material for the ceramic layers. Possible capacitor materials specifically include: COG, X7R, Z5U, Y5V or HQM materials. Involved here are single or multiphase oxide systems with specific characteristics. The use of capacitor materials is especially possible if an EMI broadband filter is supposed to be realized.

Another embodiment of the component provides a varistor ceramic as the material for the ceramic layers. In this case, specifically an ESD filter can be realized. Possible material systems specifically include: ZnO—Bi and ZnO—Pr.

Another embodiment of the component provides a material as the material for the electrode layers, which material contains one or more materials from the following list of materials: silver, palladium, platinum, silver-palladium alloys, silver-platinum alloys, copper, nickel.

These materials have the advantage that they exhibit good electrical conductivity. In addition, they can be sintered together with an appropriate paste and combined with the ceramic layers preferably used here.

Another embodiment of the component provides a material as the material for layer resistors, which material contains one or more elements from the following list of materials: silver, palladium, platinum, silver-palladium, silver-platinum, silver-palladium-platinum.

These materials have the advantage that they can be sintered together with the materials preferably used here for the ceramic layers, and that when they are sintered together they do not damage the varistor ceramics described here. Another embodiment of the component provides a material as the material for the layer resistor, especially for a layer resistor located on the top surface of the base body, which material contains one or more elements from the following list of materials: $RuO_2$, $Bi_2Ru_2O_7$, C, $Ti_2N$, $LaB_6$, $WO_2$, $Al_2O_3$, and various PbO compounds.

In another embodiment of the component, the components integrated into the component form an RC filter, an T filter or a Π filter.

In another embodiment of the component, the components integrated into the component from an ESD filter.

In another embodiment of the component, all ceramic layers are made from a uniform ceramic material.

Also indicated is a switching mechanism with the component, whereby the component is executed so that it contains two filters, and whereby the component connects an amplifier and a speaker.

The component and a switching mechanism is explained in greater detail below using exemplary embodiments and related figures.

DESCRIPTION OF THE DRAWINGS

FIG. 1 illustrates a component in a schematic profile.

FIG. 2 illustrates a sectional view of the component from FIG. 1 by means of the section planes indicated by II-II.

FIG. 3 illustrates a sectional view of the component from FIG. 1 by means of the section planes indicated by III-III.

FIG. 7 illustrates an equivalent circuit diagram of the components represented in FIGS. 1 through 6.

FIG. 8 illustrates another equivalent circuit diagram corresponding to one part of FIG. 7.

DETAILED DESCRIPTION

Figure 4:
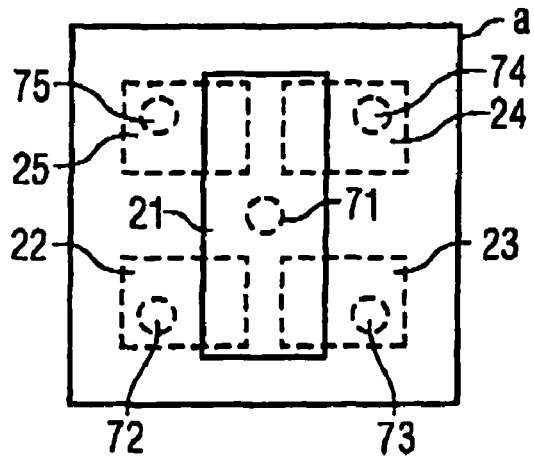
FIG. 4 illustrates a sectional view of the component from FIG. 1 by means of the section planes indicated by IV-IV.

The same elements or elements with the same functions or the same structure are indicated by the same reference numbers.

FIG. 1 illustrates a component in a schematic profile. The component comprises a base body that is formed from ceramic layers 1, 11 and 12. Ceramic layers 1 are stacked one on top of the other and are connected to one another by a common sintering process or are sintered together. The top ceramic layer 11 and the bottom ceramic layer 12 of the sequence are also connected to the ceramic layers 1 by being sintered together. Electrode layers 21, 22 and 23 are arranged between ceramic layers 1. Electrode layers 21 form a sequence of electrode layers 21 lying one on top of the other. They are connected in an electrically conductive manner by a through contact 71 together with a contact surface 61 located on the top side of the component.

The through contact 71, as well as the contact surface 61 and the ground connection GND, which in the example from FIG. 1 is executed as a solder ball, are represented by dotted lines; i.e. these elements are not located in the section plane but are located behind it. They are only shown to further clarify the elements that are visible in the section.

The electrode layers 21, together with the electrode layers 22 and the electrode layers 23, which are arranged on opposite sides of the through contact 71, in each instance form a capacitor 32, 33. The electrode layers 22 belonging to the capacitor 32 are connected to a contact surface 62, which is arranged on the top side of the component, by means of the through contact 72.

In a similar manner, the electrode layers 23 are connected to a contact surface 63 on the top side of the component by means of the through contact 73.

The contact surfaces 61, 62 and 63 can be equipped with solder balls in order to form connections $A_1$, $A_3$ and GND. In this connection it should be noted that the electrode layers are not led out to the edge of the component because no contact is needed out from the side surfaces of the base body. Rather, the contacts are made exclusively via through contacts 71, 72 and 73. These through contacts 71, 72 and 73 run perpendicular to the ceramic layers 1, 11 and 12.

On the bottom of the base body, at a plane that is distinct from all planes in which an electrode layer 21, 22 or 23 is arranged, is arranged a phase gate 41. In the example form FIG. 1, the phase gate 41 has the form of a layer resistor 81. As is evident from FIG. 5, the layer resistor 81 is executed in the form of a path curved in several places. The layer resistor 81 makes contact with the same through contacts 72, 73 that also contact the electrode layers 23, 23. Using the through contacts 72, 73 both to contact the electrode layers 22, 23 and to contact the layer resistor 81 advantageously reduces the component's need for space because no additional contacts are needed for the layer resistor 81. The layer resistor 81 can also be arranged just as well on the top of the base body.

The layer resistor 81 illustrated in FIG. 1 is arranged between two ceramic layers 1. It is therefore especially advantageous if the layer resistor 81 consists of a material that can be sintered together with the ceramic layers 1, 11 and 12. It is specifically possible to use for this purpose a material that is also used for the electrode layers 22, 21, and 23. It can be, for example, silver, palladium or another one of the suitable materials described above.

The solder balls in FIG. 1 are not absolutely necessary; they can be dispensed with and contact can be made solely by means of the contact surfaces 61, 62 and 63.

The layers 21 and 22, or 21 and 23, in each instance form multi-layered capacitors.

FIG. 2 illustrates a profile by a component according to FIG. 1, whereby the footprint (a) of the component is indicated by the surface of the square. In the example from FIG. 2, this footprint (a) is less than 2.5 mm$^2$, typically 1.37 mm$^2$, and thus corresponds to model 0505.

In FIG. 2, one section is indicated by I-I, which indicates the plane of the section from FIG. 1. FIG. 2 illustrates the through contacts 72, 73, 75 and 75, which in each instance connect a stack of electrode layers to a contact surface on the top side of the component. At the same time, the through contact 72 contacts the electrode layers 22, the through contact 73 contacts the electrode layers 23, the through contact 74 contacts the electrode layers 24 and the through contact 75 contacts the electrode layers 25. It should be noted that in FIG. 2, as in all the other figures that follow, elements that do not lie in the respective section plane are indicated by dotted outlines. FIG. 2 illustrates the electrode layer 21, which according to FIG. 1 contacts the common contact surface 61, which forms the GND connection. FIG. 2 illustrates how a common electrode layer 21 overlaps four electrode layers (22, 23, 24 and 25) belonging to different capacitors. This drawing also illustrates the very compact design, by means of which four capacitors can be integrated in a space-efficient manner into a single component.

FIG. 3 illustrates additional electrode layers 22, 23, 24 and 25, which are connected to the corresponding through contacts 72, 73, 74 and 75. In the middle of FIG. 3 is also illustrated through contact 71. FIG. 3 also makes clear that the electrode layers that in each instance belong to another through contact do not overlap one another. In each instance they only overlap with a common electrode layer 21, as is clear from FIG. 2.

FIG. 4 illustrates a common electrode layer 21, which the electrode layers 22, 23, 24 and 25 (represented by dotted lines) overlap.

Figure 5:
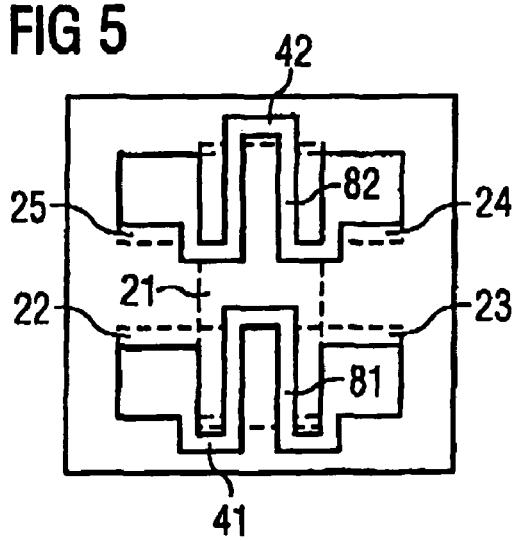
FIG. 5 illustrates a sectional view of the component from FIG. 1 by means of the section planes indicated by V-V.

FIG. 5 illustrates layers resistors 81, 82, which form phase gates 41, 42 and which are arranged on the bottom of the component. Each layer resistor 81, 82 exhibits the form of a path curved in several places, through which by using materials that conduct relatively well, a usable electrical resistor can be produced by having the path exhibit a high resistance through the many curves and the substantial conductive length that can be achieved even in tight spaces, and at the same time through narrow widths.

Figure 6:
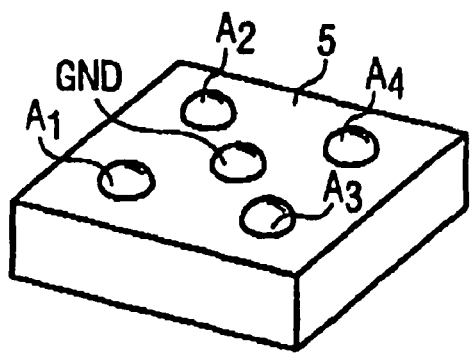
FIG. 6 illustrates a perspective drawing of the component from FIG. 1.

FIG. 6 illustrates the component from FIG. 1 in a perspective drawing where outer connections $A_1$, $A_2$, $A_3$ and $A_4$, as well as a ground connection GND are shown. The connections are thus located on the top surface of the component.

For example, the bottom ceramic layer 12 along with its bottom side forms the footprint of the base body. The upper ceramic layer 11 along with its upper side then forms the top surface of the base body. The other flat surfaces of the base body can be described as side surfaces. In this case, the connections $A_1$, $A_2$, $A_3$, $A_4$, and a ground connection GND are arranged on the footprint or on the top surface of the component in order to obtain the special advantages of the component illustrated here.

FIG. 8 illustrates a simple equivalent circuit diagram for one part of the component that is shown in FIG. 1. A Π filter is formed between the connections $A_1$ and $A_3$ and the ground connection GND. This Π filter is formed by a resistor $R_1$, which is represented by the layer resistor 81. A first capacitor $C_1$ connects the connection $A_1$ and the ground connection GND. This capacitor is represented by the capacitor 32. A second capacitor $C_2$ connects the connection $A_3$ and the ground connection GND. This capacitor $C_2$ is represented by the capacitor 33 in FIG. 1. The components together form a Π filter, as is clear from FIG. 8. Using a capacitor ceramic for the ceramic layers can preferably form such a Π filter.

FIG. 7 illustrates another variant for the equivalent circuit diagram of the components shown in FIG. 1. The main difference with regard to FIG. 8 is that a varistor ceramic is used for the ceramic layers 1, 11 and 12 instead of the capacitor ceramic. In this case, a voltage-dependent resistor VDR1, VDR2, VDR3, VDR4 is obtained parallel to each capacitor $C_1$, $C_2$, $C_3$, $C_4$. Another difference shown in FIG. 7 with regard to FIG. 8 is a circuit that is not shown in FIG. 1, but which is at least partially evident in FIGS. 2 through 5. The capacitors $C_3$ and $C_4$ are thus formed by the common electrode layer 21 and the electrode layers 25 or 24. The layer resistor 82 forms the resistor R2, which lies between the connections A2 and A4.

En ESD filter can be built with the components shown in FIG. 7.

Figure 9:
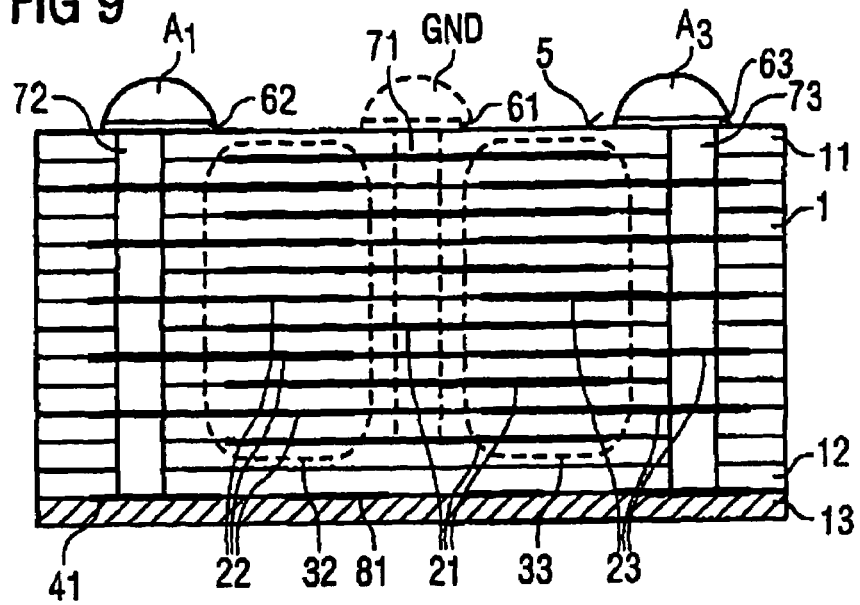
FIG. 9 illustrates another component in a schematic profile.

FIG. 8 illustrates another embodiment for a component. One significant difference with regard to FIG. 1 is that the phase gate that again is in the form of a layer resistor 81 is not arranged between two ceramic layers. Rather, the layer resistor 81 is arranged between the bottom ceramic layer 12 and a glazing layer 13. This has the advantage that materials that cannot be sintered together with the ceramic layers can be used for the layer resistor 81. One problem is, for example, the common sintering of materials preferably used for layer resistors such as $RuO_2$ and the varistor ceramics used for varistors or ESD filters. For this reason, the component according to FIG. 9 is designed so that the ceramic layers are first debound and sintered and then the layer resistor 81 or the $RuO_2$ paste forming the layer resistor is applied. In the subsequent temperature step, the layer resistor is then fixed and strengthened without, however, significantly damaging the varistor ceramic. The glazing layer 13 is then applied; this layer covers the outside of layer resistor 81 and thus is integrated into the component or into the base body. Apart from this difference, what was said for the component illustrated in FIG. 1 applies to the component illustrated in FIG. 1.

Figure 10:
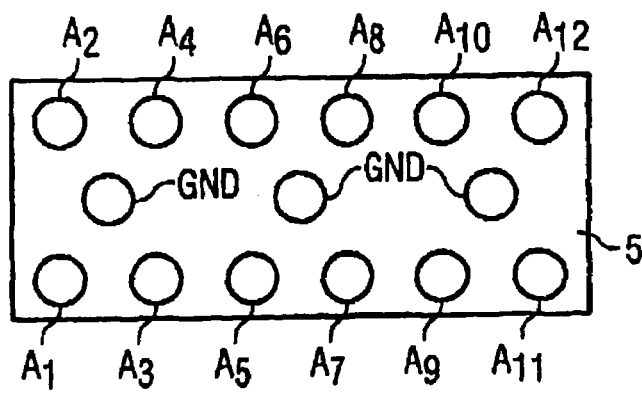
FIG. 10 illustrates a top view of another component.

FIG. 10 illustrates a top view of another component containing ten different capacitors. The outside of each of the ten capacitors is contacted by connections $A_1$, $A_2$, $A_3$, $A_4$, $A_5$, $A_6$, $A_7$, $A_8$, $A_9$, $A_{10}$, $A_{11}$ and $A_{12}$. Ground connections GND are provided in the center of the component. These ground connections GND could also be consolidated into a common, single and centralized ground connection GND. FIG. 10 illustrates a top view of the surface 5 of the component. The component according to FIG. 10 can be thought of as consisting of three components according to FIG. 6, which are laid one next to the other. The individual electrode layers of the capacitors are thus unchanged and independent of one another. Only the common electrode layers that are fed to the common ground connections are conducted over the entire length of the component from FIG. 10.

In other words, FIG. 10 illustrates a component that, for example, corresponds to model 0612 and contains twelve capacitor surfaces. The footprint of the component is thus smaller than 8 mm$^2$, and preferably is 5.12 mm$^2$.

Figure 11:
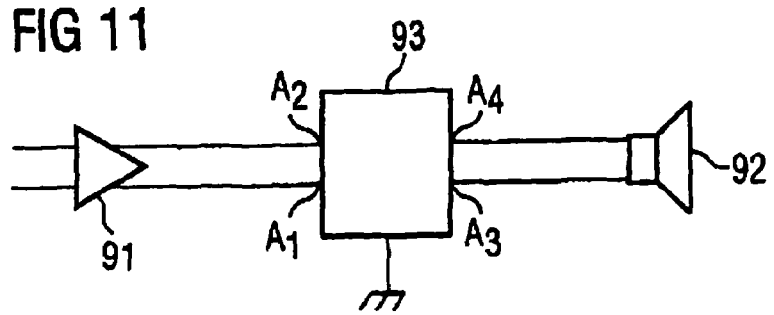
FIG. 11 illustrates a switching mechanism with the component in a schematic representation.

FIG. 11 illustrates a switching mechanism with a component described here, whereby an amplifier 91 is connected to a speaker 92. Such an arrangement is conceivable, for example, in a cellphone. The speaker 91 is connected by means of two lines to the speaker 92. An electrical component of the type described here connects the amplifier 91 and the speaker 92. Both inputs along with the connections $A_1$ and $A_2$ are connected to the speaker 91. Both outputs of the component 93 along with the connections $A_4$ and $A_3$ are connected to the speaker. A ground connection is provided to the component 93 as well. The component 93 can be an EMI filter, for example. This allows electromagnetic interferences that are transmitted as a signal or as an unwanted signal between the amplifier 91 and the speaker 92 to be filtered out.

For example, the component 93 in FIG. 11 can represent a switching mechanism according to FIG. 7, where a filter switch in the form of a Π filter with additionally integrated varistors is realized between the connections $A_1$ and $A_3$ and between the connections $A_2$ and $A_4$.

Figure 12:
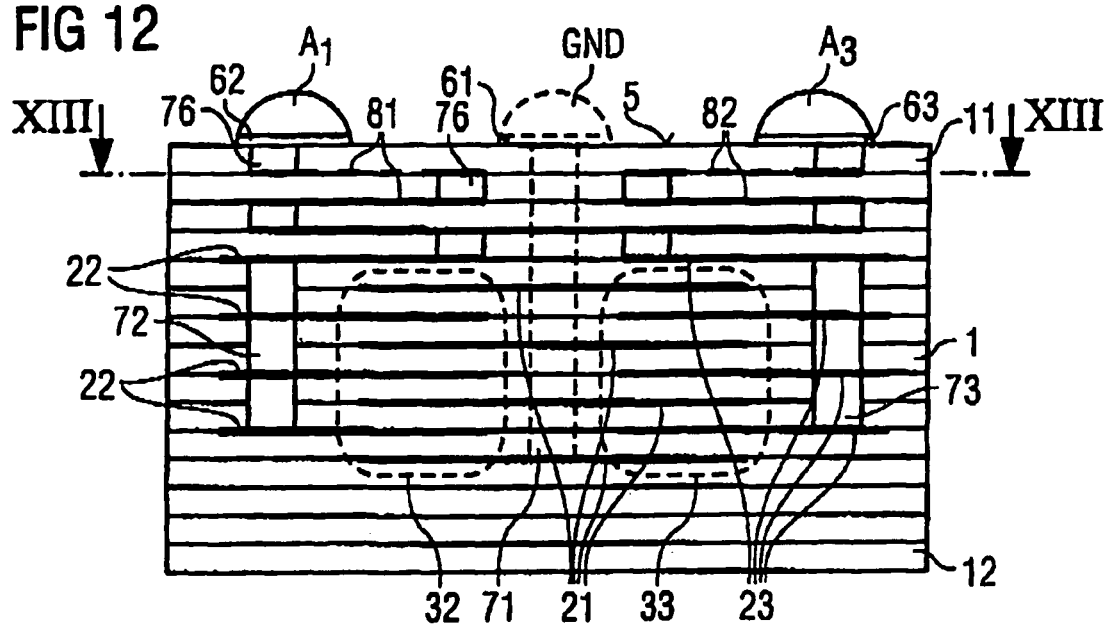
FIG. 12 illustrates a schematic sectional view of another component.
Figure 13:
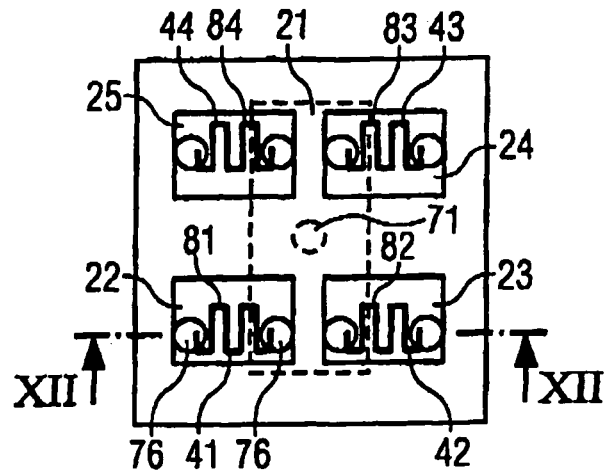
FIG. 13 illustrates a sectional view of the component from FIG. 12 by means of the planes indicated by XIII-XIII.

FIG. 12 illustrates another embodiment of the component, where layer resistors 81, 82 are integrated into the top of the component as phase gates. FIG. 12 illustrates a profile along the line XII-XII, which is illustrated in FIG. 13 by a dotted line. FIG. 13 in turn illustrates a profile along the plane XIII-XIII, which is illustrated in FIG. 12.

The layer resistors 81, 82 illustrated in FIG. 12 are arranged in each instance between two ceramic layers 1. At the same time, each of the capacitors 32, 33 is attached to three layer resistors 81 or 82 that are stacked one on top of another at different levels. The layer resistors 81, 82 are connected on one side to the contact surfaces 62, 62 and on another side to the through contacts 72, 73 by means of additional through contacts 76, which in each instance only cross ceramic level 1 and are also displaced to the sides of one another so that a path of electricity in the form of a meander is created by the top ceramic layers 11, 1. The top of each layer resistor 81, 82 is executed in the form of an electrically conductive path running in the form of a meander containing several curves. The layer resistors 81, 82 located underneath run as linear paths between two additional through contacts 76. The through contacts in this instance also support the circuitry of the components contained in the base body. A conductive layer 26 for electrical connection is provided between each of the bottom layer resistors 81, 82.

Figure 14:
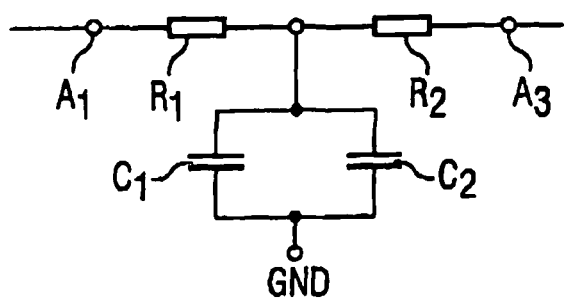
FIG. 14 illustrates an equivalent circuit diagram for a filter from the component according to FIG. 12.

FIG. 13 illustrates the step (already described above) in one plane of FIG. 12, whereby it should be noted that the bottom of the component from FIG. 12 appears essentially the same as in FIGS. 1 and 9, whereby a total of four outer connections ($A_1, A_2, A_3, A_4$) are provided and each of these connections is assigned to the connection of a filter switch. It is clear from FIG. 13 that a total of four groups of layer resistors (81, 82, 83, 84) are integrated into the component. Accordingly, a filter switch can be realized, as is illustrated in FIG. 14 for two of the connections ($A_1, A_3$). FIG. 14 illustrates a T filter. Two ohmic resistors ($R_1, R_2$) are connected in sequence between the connections $A_1$ and $A_3$. These ohmic resistors are arranged according to their resistance value by the layer resistors 81 or 82 from FIG. 12 that in each instance lie one on top of the other. In other words, in the end they are a serial connection of several individual resistors.

A center tap that is connected to a ground connection GND is also provided between the resistors, whereby a parallel connection consisting of two capacitors $C_1, C_2$ is connected between the center tap and the ground connection. These capacitors $C_1, C_2$ are formed by the capacitors 32, 33 from FIG. 12.

Figure 15:
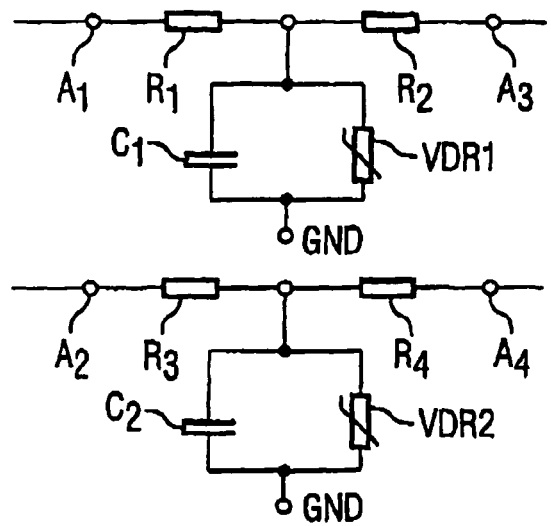
FIG. 15 illustrates an equivalent circuit diagram for the component from FIG. 12.

FIG. 15 illustrates another variant for a filter switch to be realized with a component according to FIG. 12. Thus, FIG. 15 corresponds to the arrangement of the outer connections $A_1, A_2, A_3, A_4$ from FIG. 7. However, the difference with regard to FIG. 7 does not involve Π filters but rather T filters. By using a varistor material for the ceramic layers 1, 11 and 12, a voltage-dependent resistor can be realized parallel to the capacitor that for its part is a parallel connection consisting of two capacitors (see FIG. 14). Thus two filter switches are created, whereby a first T filter connects the outer connections $A_1, A_3$ and a second T filter connects the outer connections $A_2, A_4$. Each of these T filters contains two ohmic resistors that are connected in sequence and a combined voltage-dependent resistor VDR1, VDR2 and capacitor $C_1, C_2$ connected to the center tap and inserted against the ground connection. Each capacitor $C_1, C_2$ is for its part a parallel connection consisting of two capacitors. $C_1$, for example, is formed from a parallel connection of the capacitors 32 and 33 from FIG. 12.

Figure 16:
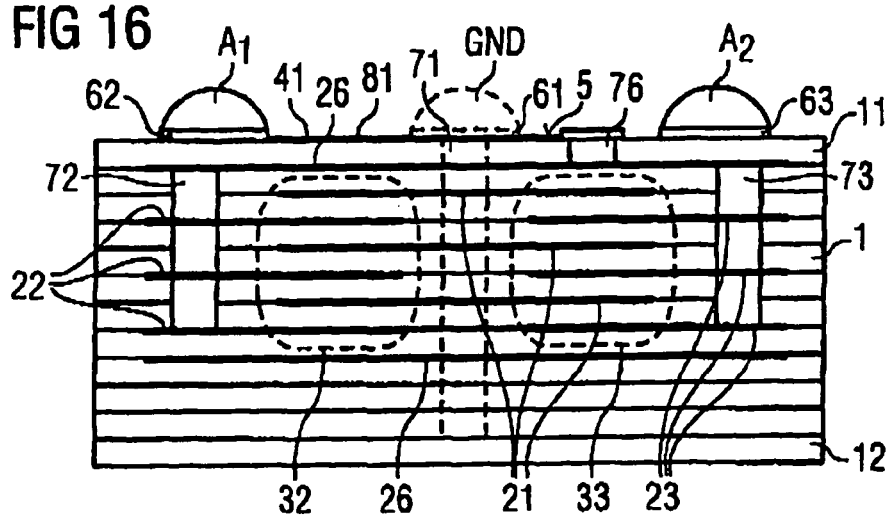
FIG. 16 illustrates another component in a schematic sectional view.

FIG. 16 illustrates another embodiment for a component of the type described here. A layer resistor 81 is arranged on the top surface of the base body. It is connected by means of an additional through contact 76 to interior elements of the base body. Specifically, the layer resistor 81 is connected to an electrically conductive layer 26 by means of the additional through contact 76, which for its part reproduces a connection to a through contact 72 and therefore to a capacitor 32.

Figure 17:
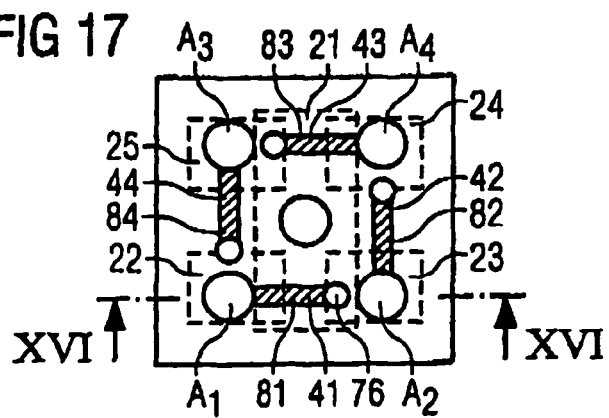
FIG. 17 illustrates a top view of the component from FIG. 16.

FIG. 17 illustrates a top view from above of the component according to FIG. 16. It illustrates a total of four layer resistors (81, 82, 83 and 84), which in each instance run from an outer connection $A_1, A_2, A_3, A_4$ toward an adjoining outer connection and are then connected to additional interior elements of the base body by means of an additional through contact 76. In contrast to FIG. 13 and FIG. 5, the layer resistors 81, 82, 83 and 84 are conducted as linear running paths. Superimposition from the outside onto the surface of the base body has the advantage that a broader range of materials is available for the material of the layer resistors 81, 82, 83 and 84. In this instance it makes no difference if the material of the layer resistor can be sintered together with the material of the ceramic layers. In this instance, the subsequent superimposition of the layer resistor can also be completed after the sintering and if necessary before an additional temperature step that is applied to the sequence of ceramic layers 1, 11 and 12 that are stacked one on top of another.

The filter switches that can be realized along with a component according to FIG. 16 or FIG. 17 correspond to those that can be realized along with the components according to FIG. 12 or FIG. 13, with the difference that greater ohmic resistances can be realized. In this instance, the layer resistor 82 in FIG. 17 corresponds to the resistor $R_2$ in FIG. 14 and FIG. 15.

Figure 18:
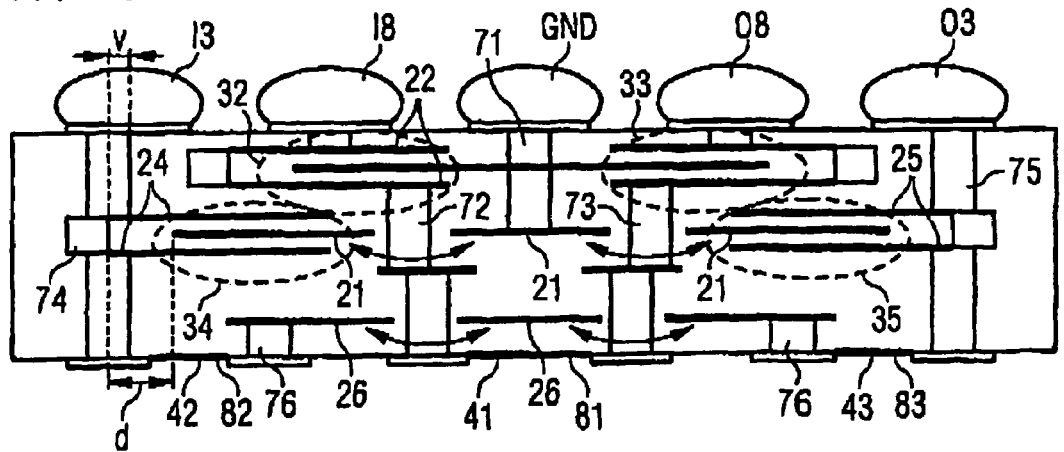
FIG. 18 illustrates a sectional view of another component.

FIG. 18 illustrates another embodiment of an electrical component, whereby a multitude of outer connections I1, I2, I3, I4, I5, I6, I7, I8, I9, I10 and five ground connections GND and other outer connections O1, O2, O3, O4, O5, O6, O7, O8, O9, O10 are provided. At the same time, the connections I1 through I10 are provided as signal inputs. The connections O1 through O10 are considered signal outputs. The ground connections GND are considered to be connected to a ground.

Figure 19:
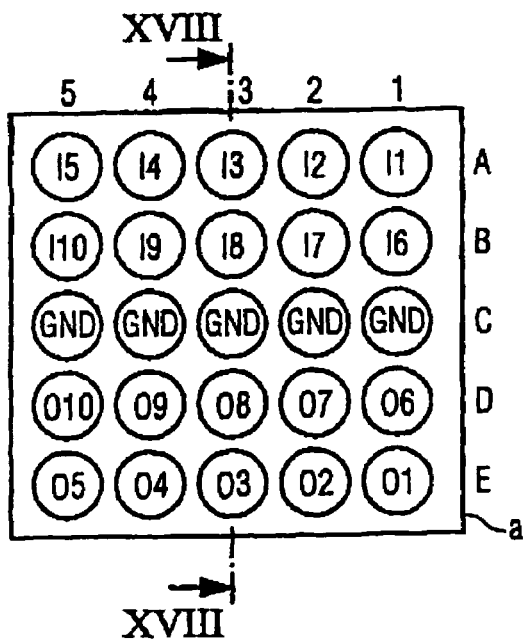
FIG. 19 illustrates a top view of the component from FIG. 18.

To clarify the interior design of the component, FIG. 18 illustrates a section along the line 18-18 in FIG. 19.

As illustrated in other examples, contact surfaces that can be selectively equipped with solder balls are arranged on the surface 5. At the same time, the input I8 is connected by means of through contacts to electrode layers 22, which along with electrode layers 21 of the ground electrode GND form a capacitor 32. A corresponding capacitor 33 for the output O8 is formed symmetrical to that. The through contacts 72, 73 do not run in a straight line from top to bottom through the base body. Rather, they are placed to the sides of one another in order to make the component geometrically richer in variants, whereby a higher compactness can be achieved.

In addition to the electrode layer 21, which forms the capacitor 32, 33, another bottom electrode layer 21 is connected to the ground electrode GND by means of the through contact 71. The lower electrode layer 21 appears to break down into three different parts. However, this is only the case in the cross-sectional plane. In the cross-sectional plane the through contacts 72, 73 run through the lower electrode surface 21. The through contacts 72, 73 do not electrically contact the lower electrode level 21. Double arrows are used to indicate that the three parts of the lower electrode layer 21 are connected to one another in an electrically conductive manner. The lower electrode layer 21, along with electrode layers 24 or with electrode layers 25, forms two other capacitors 34, 35. These capacitors 34, 35 are connected to the output I3 or to the output O3 by means of through contacts 74, 75.

The lower part of the base body contains circuiting structures to integrate resistors. Layer resistors 82, 83, and 81 are arranged underneath the base body. The layer resistor 81 can exhibit the value 100 Ω in an exemplary embodiment, whereas the layer resistors 82 and 83 exhibit the value 50 Ω. The layer resistor 81 is at the same time connected to the input I8 and the output O8 by means of the through contacts 72 and 73. The layer resistors 82, 83 are connected to one another by an interior circuit, namely the conductive layer 26, forming a serial connection between the layer resistor 82 and the layer resistor 83. Like the lower electrode layer 21, the conductive layer 26 is not, as could be inferred from the drawing, broken down into three different parts; rather, the parts of layer 26 are connected to one another in a conductive manner, as the curved double arrows indicate. The conductive layer 26 is connected to the layer resistors 82, 83 by means of additional through contacts 76. The layer resistors 82, 83, along with the input I3 and/or the output O3, are connected via the through contacts 74, 75.

The through contacts 74, 75 have an area that provides a displacement v. By means of this displacement, the ground-side electrode layer 21 is able to find an adequate insulation zone for lead-through 74 in order to avoid electrical flashovers.

Thus, it is advantageous if the section of the through contact 74, which is placed to the side of the other sections of through contact 74, has a height that corresponds to the distance to both electrode layers 24. In this case, the placement is especially easy and simple to realize.

Figure 20:
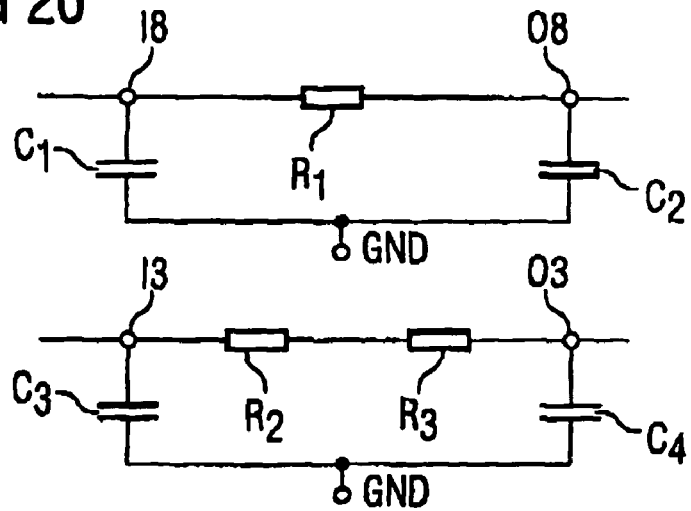
FIG. 20 illustrates an equivalent circuit diagram for one part of the component from FIG. 18.

FIG. 20 illustrates an equivalent circuit diagram for the component from FIG. 18 for the connection between the input I8 and the output O8. This involves a Π filter, whereby a resistor $R_1$ connects the input and the output; this is represented by the layer resistor 81. The capacitors $C_1$ and $C_2$ are formed by the capacitors 32, 33 from FIG. 18.

Another Π filter connects the input I3 and the output O3, whereby a serial connection consisting of resistors $R_2$ and $R_3$ replaces the resistor $R_1$. Choosing the appropriate resistance values $R_2$ and $R_3$ can guarantee that the filter that connects the input I3 and the output O3 exhibits the same electrical characteristics as the filter that connects I8 and O8. Specifically, this means: $R_1=R_2+R_3$. Incidentally, the values for the capacities can also be the same, which would mean: $C_1=C_2=C_3=C_4$.

Thus, altogether a plurality of ten filters can be integrated into a single component with a component according to FIG. 19. This is achieved with a relatively small footprint a, which can be smaller than 5.12 mm².

Figure 21:
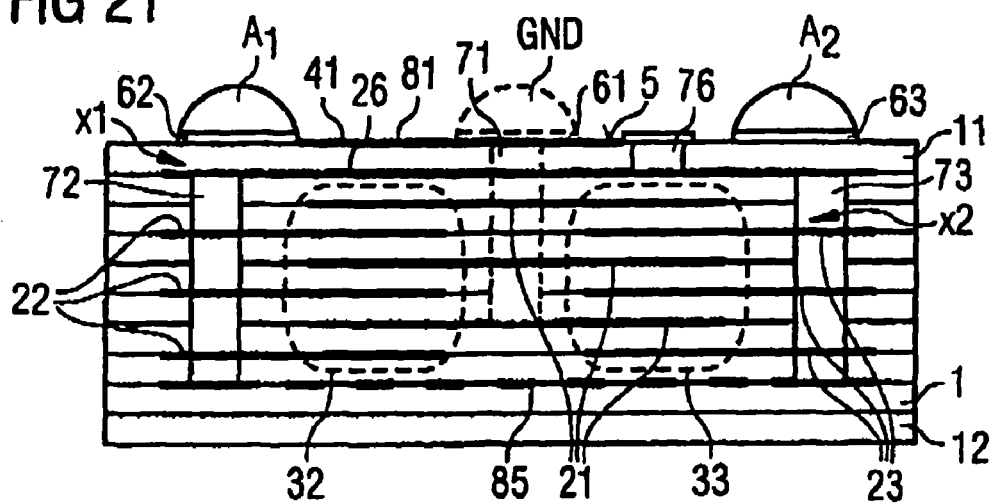
FIG. 21 illustrates a schematic sectional view of another component.

FIG. 21 illustrates a component that is similar to the component from FIG. 16. In contrast to the component from FIG. 16, no contact between the additional through contact 76 and the through contact 73 is provided. This means that the right side of the conductive layer 26 ends at the additional through contact 76. In addition, between the through contact 72 and the through contact 73 a layer resistor 82 is provided that is in the form of a conductive path in the form of a meander and which connects the two through contacts 72, 73 to one another. Incidentally, the top view from FIG. 17 is also true for the component from FIG. 21.

Figure 22:
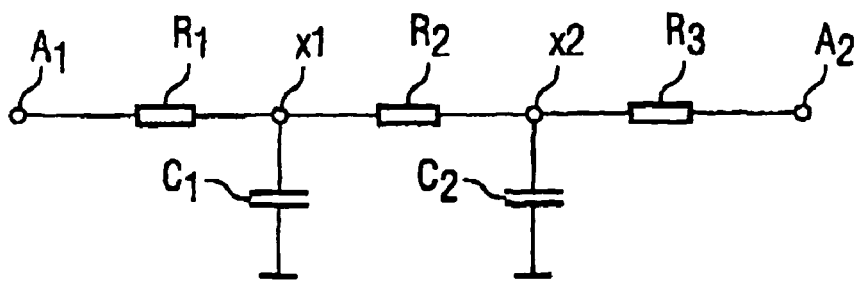
FIG. 22 illustrates an equivalent circuit diagram for the component from FIG. 21.

FIG. 22 illustrates a Π filter as an equivalent circuit diagram for the component according to FIG. 21, which filter also has two matching resistors $R_1$ and $R_3$ that support impedance adjustment and exhibit the typical 50 Ω.

For further clarification, FIG. 21 illustrates the nodes x1, x2, which are located between the resistors $R_1$ and $R_2$.

The capacitors 32, 33 from FIG. 21 form the capacitors $C_1$ and $C_2$. The resistor $R_1$ is formed from the layer resistor 81 on the surface of the component in FIG. 21. The layer resistor 82 from FIG. 21 forms the resistor $R_2$. The resistor $R_3$, which is formed by the layer resistor 85, can only be seen in the top view from FIG. 17.

The invention is not limited to the exemplary embodiments that are illustrated and described here. The invention also comprises all technical modifications as well as partial and subcombinations of the features and methods that have been described and/or illustrated here. The component may specifically contain further additional elements.

Specifically, the component could be an electroceramic multi-layered component that is produced by stacking ceramic green sheets of film on top of one another, which sheets of film are produced by applying pressure with electrode layers containing a metal paste as well as by punching holes in the ceramic layers and filling them with a suitable metalliferous paste to produce the through contacts.

The invention claimed is:

1. An electrical component comprising:
   ceramic layers that are stacked to form a base body;
   electrode layers disposed among the ceramic layers to form at least two capacitors having a common electrode layer, each capacitor having an other associated electrode layer;
   at least one phase gate on a ceramic layer that corresponds to a surface of the base body;
   contact surfaces on a top surface of the base body;
   at least two through contacts that electrically connect the respective other associated electrode layers to the contact surfaces, the at least two through contacts being inside the base body at least in part;

at least one common through contact that electrically connects the common electrode layer of the at least two capacitors, the common through contact being arranged in an area between the at least two through contacts, wherein the phase gate is electrically connected to the at least two through contacts, and wherein side surfaces of the base body are substantially free of surface metallic contacts and of metal plating.

2. The electrical component of claim 1, wherein all ceramic layers comprise a same material.

3. The electrical component of claim 1 wherein all ceramic layers comprise an electrical functional ceramic.

4. The electrical component of claim 1 wherein electrical contact to the electrode layers and to the at least one phase gate is achieved via the contact surfaces.

5. The electrical component of claim 1, wherein the electrode layers and the at least one phase gate are disposed in planes of the base body.

6. The electrical component of claim 1, wherein the at least two capacitors and the at least one phase gate form a filter switch.

7. The electrical component of claim 1 further comprising:
a common contact surface in a central region of the top surface, the common contact surface being electrically connected to the common electrode layer.

8. The electrical component of claim 7, which is symmetrical relative to a plane that corresponds to the common contact surface.

9. The electrical component of claim 1 wherein the at least one phase gate comprises a layer resistor or a layer inductor.

10. The electrical component of claim 1, further comprising:
a plurality of filters.

11. The electrical component of claim 1, further comprising:
one or more broadband filters for reducing electromagnetic interference.

12. The electrical component of claim 1, further comprising:
one or more varistors.

13. The electrical component of claim 1, wherein the common electrode layer overlaps four different regions of other electrode layers.

14. The electrical component of claim 1 further comprising:
several identical or different filters.

15. The electrical component of claim 1,
wherein the at least one phases gate comprises a layer resistor between two ceramic layers, the layer resistor having an electrical resistance between $0.01\Omega$ and $50\Omega$.

16. The electrical component of claim 1,
wherein the at least phase gate comprises a layer resistor on an exterior side of a ceramic layer, the layer resistor having an electrical resistance between $0.05\Omega$ and $100\Omega$.

17. The electrical component of claim 1, wherein the base body has a footprint that is smaller than $2.5\ mm^2$, and wherein the at least two capacitors comprise at least four capacitors and the at least one phase gate comprises at least two phase gates.

18. The electrical component of claim 1, wherein the base body has a footprint that is smaller than $5.12\ mm^2$, and wherein the at least two capacitors comprise at least eight capacitors and the at least one phase gate comprises at least four phase gates.

19. The electrical component of claim 1, wherein the base body has a footprint that is smaller than $8\ mm^2$, and wherein the at least two capacitors comprise eight, ten, twelve or more capacitors and the at least one phase gate comprises at least four phase gates.

20. The electrical component of claim 1, wherein all capacitors in the electrical component have substantially a same capacitance, and wherein the electrical component comprises resistors, all of the resistors having substantially a same resistance.

21. The electrical component of claim 1, wherein at least two capacitors in the electrical component have different capacitances, and wherein the electrical component comprises resistors, at least two of the resistors having different resistances.

22. The electrical component of claim 1, wherein at least one ceramic layer comprises a capacitor material that is selected from the following materials: C0G, X7R, Z5U, Y5V, HQM.

23. The electrical component of claim 1, wherein at least one ceramic layer comprises a varistor ceramic that is selected from the following materials: ZnO—Bi, ZnO—Pr.

24. The electrical component of claim 1, wherein at least one electrode layer comprises silver, palladium, platinum, a silver-palladium alloy, a silver-platinum alloy, copper or nickel.

25. The electrical component of claim 1,
wherein the at least one phase gate comprises a layer resistor comprising silver, palladium, platinum, silver-palladium, silver-platinum or silver-palladium-platinum.

26. The electrical component of claim 1,
wherein the at least phase gate comprises a layer resistor comprising one or more of the following materials: $RuO_2$, $Bi_2Ru_2O_7$, C, $Ti_2N$, $LaB_6$, $WO_2$, $Al_2O_3$, and a PbO compound.

27. An apparatus comprising:
an amplifier;
a speaker; and
a component according to claim 1, the component connecting the amplifier and the speaker, the component being connected to a ground connection.

* * * * *

UNITED STATES PATENT AND TRADEMARK OFFICE
CERTIFICATE OF CORRECTION

PATENT NO. : 7,710,710 B2  
APPLICATION NO. : 11/220352  
DATED : May 4, 2010  
INVENTOR(S) : Sebastian Brunner et al.

It is certified that error appears in the above-identified patent and that said Letters Patent is hereby corrected as shown below:

In the Claims:

Col. 13, line 48, claim 15 delete "phases" and insert -- phase --.

Signed and Sealed this

Seventeenth Day of August, 2010

David J. Kappos
*Director of the United States Patent and Trademark Office*